(12) United States Patent
Ahn et al.

(10) Patent No.: US 8,215,011 B2
(45) Date of Patent: Jul. 10, 2012

(54) METHOD OF MANUFACTURING A PRINTED CIRCUIT BOARD

(75) Inventors: Seok Hwan Ahn, Gyunggi-do (KR); Young Gwan Ko, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 582 days.

(21) Appl. No.: 12/379,307

(22) Filed: Feb. 18, 2009

(65) Prior Publication Data

US 2010/0139960 A1    Jun. 10, 2010

(30) Foreign Application Priority Data

Dec. 8, 2008    (KR) .................. 10-2008-0124153

(51) Int. Cl.
*H01J 3/10* (2006.01)
(52) U.S. Cl. ............... 29/852; 29/825; 29/830; 29/832; 29/840

(58) Field of Classification Search ............ 29/825, 29/830, 832, 840, 852
See application file for complete search history.

(56) References Cited

U.S. PATENT DOCUMENTS

| | | | | |
|---|---|---|---|---|
| 4,145,460 A | * | 3/1979 | Finley et al. | 216/17 |
| 4,601,916 A | * | 7/1986 | Arachtingi | 204/479 |
| 5,153,986 A | * | 10/1992 | Brauer et al. | 29/846 |
| 5,502,893 A | * | 4/1996 | Endoh et al. | 29/852 |
| 6,228,511 B1 | * | 5/2001 | Sachdev et al. | 428/626 |
| 6,427,325 B1 | * | 8/2002 | Johansson et al. | 29/852 |
| 6,820,330 B1 | * | 11/2004 | Haba | 29/852 |

* cited by examiner

*Primary Examiner* — Carl Arbes

(57) ABSTRACT

Disclosed is a printed circuit board having a plating pattern buried in a via and a method of manufacturing the same. The method of manufacturing the printed circuit board includes forming a negative pattern for forming a plating pattern, thus remarkably reducing the generation of plating thickness deviation in a plating process for forming a circuit pattern, and the printed circuit board has improved electrical signal transmission properties.

6 Claims, 6 Drawing Sheets

METHOD OF MANUFACTURING A PRINTED CIRCUIT BOARD

CROSS REFERENCE TO RELATED APPLICATION

This application claims the benefit of Korean Patent Application No. 10-2008-0124153, filed Dec. 8, 2008, entitled "A printed circuit board comprising a plating-pattern buried in via and a method of manufacturing the same", which is hereby incorporated by reference in its entirety into this application.

BACKGROUND OF THE INVENTION

1. Field of the Invention

The present invention relates to a printed circuit board (PCB) having a plating pattern buried in a via and a method of manufacturing the same, and, more particularly, to a method of manufacturing a PCB, which includes forming a negative pattern for forming a plating pattern, thus remarkably reducing the generation of plating thickness deviation in a plating process for forming a circuit pattern, and to a PCB having improved electrical signal transmission properties.

2. Description of the Related Art

With the advancement of the electronics industry, the demand for increasing the functionality of electronic components and reducing the size thereof has rapidly increased. In accordance therewith, the density of a circuit pattern of a PCB must increase, and thus various methods of forming a fine circuit pattern have been devised, proposed and applied.

Among the methods of forming a fine circuit pattern, the present invention is intended to provide a PCB having a stabler construction in which a circuit pattern is buried in an insulating layer to thus realize a high density of the circuit pattern, and a manufacturing method thereof.

FIGS. 1A to 1M are cross-sectional views showing the process of manufacturing a PCB according to a conventional technique.

As shown in FIG. 1A, a double-sided copper clad laminate in which a copper foil 3 is formed on both surfaces of an insulating layer 1 is prepared. As shown in FIG. 1B, a via hole 5 is processed using a CNC drill. As shown in FIG. 1C, an electroless plating layer 7 is formed on the inner wall of the via hole 5. As shown in FIG. 1D, the via hole 5 is filled with a paste 9, and, as shown in FIG. 1E, the protruding paste 9 is removed. Thereafter, an etching resist (not shown) is layered and patterned, and then the copper foil 3 and the electroless plating layer 7, which are exposed, are removed, thus manufacturing a double-sided PCB as shown in FIG. 1F.

Next, as shown in FIG. 1G, an additional insulating layer 11 is formed on the upper and lower surfaces of the double-sided PCB, in order to form an additional build-up layer. As shown in FIG. 1H, a blind via hole 13 for exposing the lower circuit layer is processed. Next, as shown in FIG. 1I, an electroless plating layer 15 is formed on the surface of the additional insulating layer 11 and the inner wall of the blind via hole 13, and, as shown in FIG. 1J, a plating resist layer 17 is layered and patterned. Next, as shown in FIG. 1K, electroplating is performed using the electroless plating layer 15 as a lead wire, thus forming a circuit pattern 21 and a via 19 in the openings of the plating resist layer 17. As shown in FIG. 1L, the remaining plating resist layer 17 is removed, and, as shown in FIG. 1M, the exposed electroless plating layer 15 is removed, thereby manufacturing a four-layer PCB.

In the method of manufacturing the four-layer PCB, the circuit pattern of the circuit layer of the double-sided PCB is formed through a subtractive process, and the additional build-up layer is formed through SAP (Semi-Additive Process).

However, as the circuit of a PCB such as a semiconductor substrate becomes finer, the ability to use a subtractive process to form a fine circuit becomes exceeded. Thus, there is an increasing tendency to use SAP or MSAP (Modified Semi-Additive Process) to form the fine circuit.

However, in the case where the circuit layer is formed through SAP or MSAP, the size of the pad of the via 19 is increased, thus making it difficult to realize a fine circuit. To solve this problem, if the size of the via 19 is reduced, another problem of non-plating or delamination of the via 19 may occur.

Also, the case where the circuit pattern 21 is formed through electroplating according to the conventional technique is problematic in that plating deviation, specifically, a thick portion and a thin portion of the plating thickness, may result, and thus the resulting non-uniform resistance may adversely affect the transmission of electrical signals.

Although the plating deviation may result from the distance from the lead wire, etc., the generation thereof is considered to be because an electric field is dispersed on a portion of the PCB having a low wiring density upon electroplating, resulting in a low plating thickness, whereas an electric field is concentrated on the other portion of the PCB having a high wiring density, resulting in a thick signal line thickness.

SUMMARY OF THE INVENTION

Accordingly, the present invention has been made keeping in mind the problems encountered in the related art and the present invention provides a PCB which is constructed such that the generation of plating deviation is minimized when a circuit layer buried in an insulating layer is formed through a plating process and also provides a method of manufacturing the same.

An aspect of the present invention provides a method of manufacturing a PCB having a plating pattern buried in a via, including (A) providing an insulating substrate and forming a via hole in the insulating substrate, (B) forming a metal layer on an inner wall of the via hole, (C) filling the via hole with a filler, (D) forming a negative pattern for forming a circuit pattern on the insulating substrate, and selectively forming a negative pattern for forming a plating pattern in an end of the filler, and (E) forming the circuit pattern and the plating pattern in the negative pattern for forming a circuit pattern and the negative pattern for forming a plating pattern, respectively.

In the method, (B) forming the metal layer may include (i) forming a seed layer on an outer layer of the insulating substrate including the inner wall of the via hole and (ii) performing electroplating on the seed layer, thus forming the metal layer, and the method may further include removing the metal layer and the filler formed on the insulating substrate, after (C) filling the via hole.

In the method, (E) forming the circuit pattern and the plating pattern may include (i) forming a plating layer on the surface of the insulating layer including the negative pattern for forming a circuit pattern and the negative pattern for forming a plating pattern and (ii) removing the plating layer formed on the insulating substrate.

In the method, (D) forming the negative pattern may be performed using a laser drill.

The method may further include defining a circuit pattern dense region where the circuit pattern to be formed on the insulating substrate is densely disposed on the insulating substrate, before (D) forming the negative pattern, and the negative pattern for forming a plating pattern in the (D) forming the negative pattern may be formed in the filler within the circuit pattern dense region.

The method may further include (i) defining a circuit pattern dense region where the circuit pattern to be formed on the insulating substrate is densely disposed on the insulating substrate and (ii) defining a width and a depth of the negative pattern to be formed in the filler in consideration of a density of the circuit pattern of the circuit pattern dense region, before (D) forming the negative pattern.

Another aspect of the present invention provides a PCB having a plating pattern buried in a via, including an insulating substrate including an electrically insulating resin, a via hole passing through the insulating substrate, a via including a metal layer formed on an inner wall of the via hole and a filler charged in the via hole, a circuit layer including a circuit pattern buried in the insulating substrate and transmitting an electrical signal, and a plating pattern buried in an end of the filler.

The PCB may include a circuit pattern dense region where the circuit pattern is densely formed, and the plating pattern may be formed in the via within the circuit pattern dense region.

In the PCB, the circuit layer may have an exposed surface which is exposed to an outside of the insulating substrate, and a height of the exposed surface of the circuit pattern on the basis of a center line of the insulating substrate in a thickness direction may be equal to or lower than a surface height of the insulating substrate.

In the PCB, the filler may be plugging ink composed of an insulating ink paste.

In the PCB, the insulating substrate may include a core substrate made of a glass fiber-reinforced resin and an insulating layer formed on the core substrate.

In the PCB, the plating pattern may have a width and a depth defined in consideration of a density of the circuit pattern of the circuit pattern dense region.

The features and advantages of the present invention will be more clearly understood from the following detailed description taken in conjunction with the accompanying drawings.

Further, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

DESCRIPTION OF THE PREFERRED EMBODIMENTS

Figure 1A:
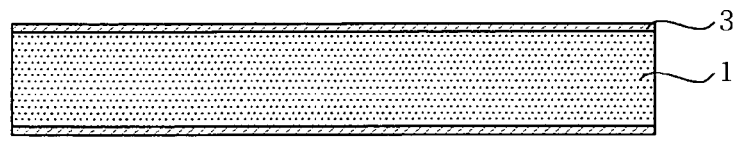
FIGS. 1A to 1M are cross-sectional views showing a process of manufacturing a PCB according to a conventional technique.
Figure 1B:
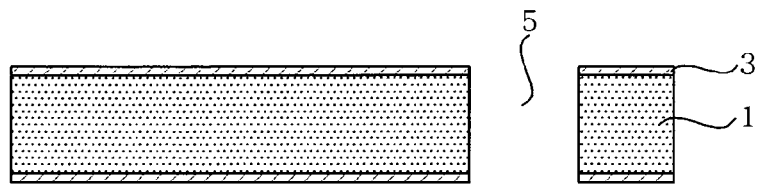
Figure 1C:
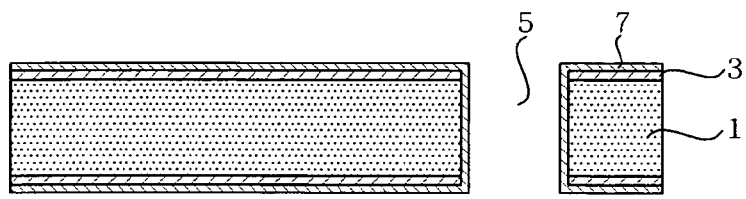
Figure 1D:
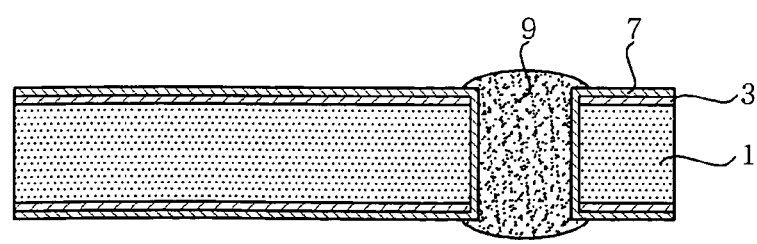
Figure 1E:
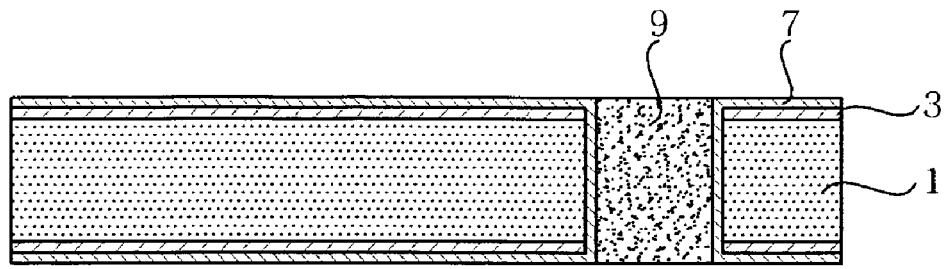
Figure 1F:
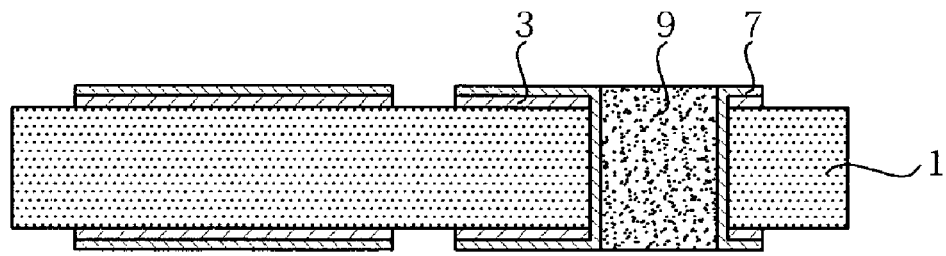
Figure 1G:
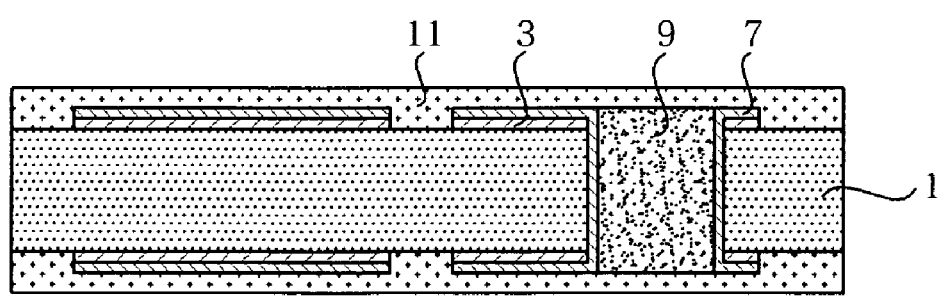
Figure 1H:
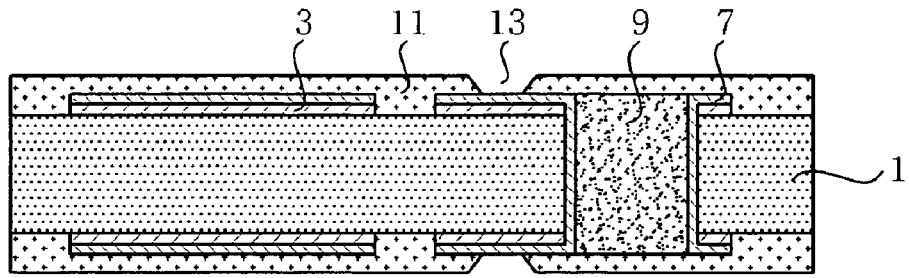
Figure 1I:
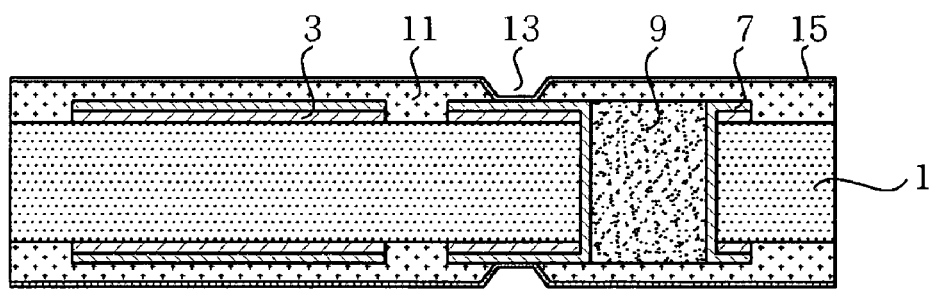
Figure 1J:
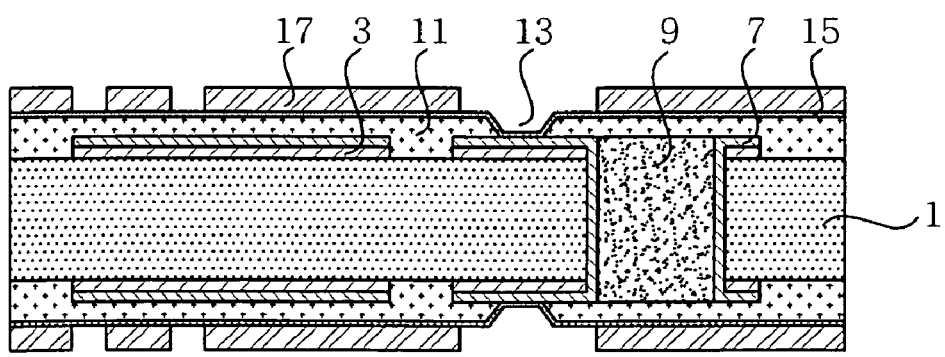
Figure 1K:
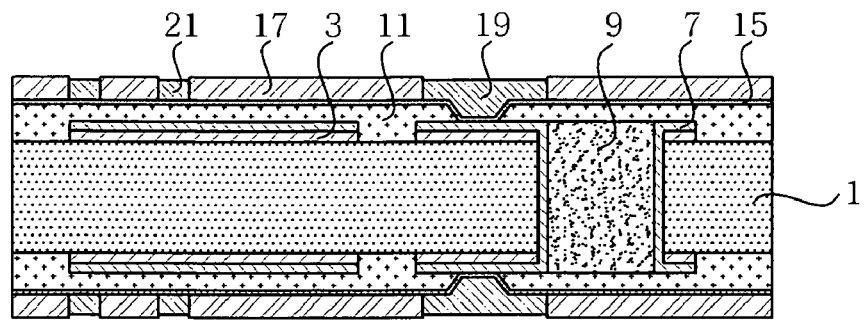
Figure 1L:
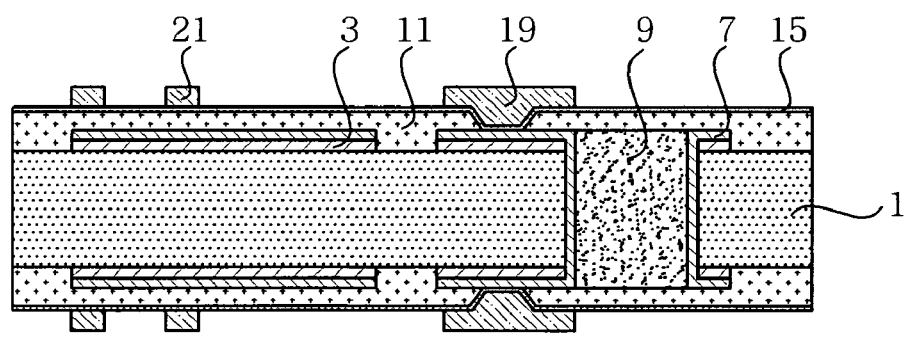
Figure 1M:
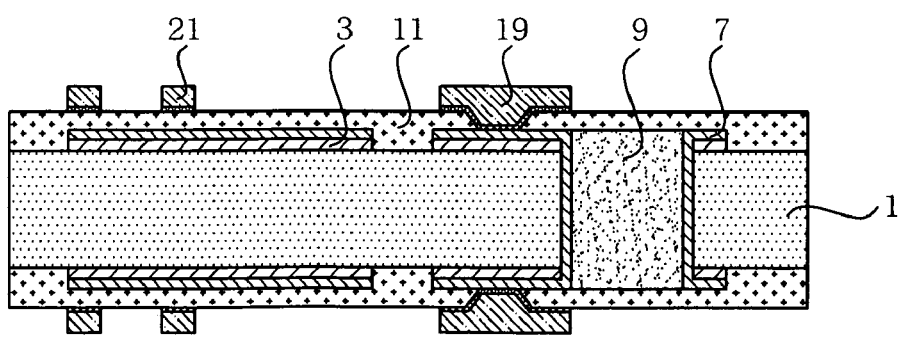

Hereinafter, a detailed description will be given of a PCB having a plating pattern buried in a via and a manufacturing method thereof according to the present invention, with reference to the appended drawings. Throughout the drawings, the same reference numerals refer to the same or similar elements, and redundant descriptions are omitted. In the description, the terms "upper", "lower" and so on are used only to distinguish one element from another element, and the elements are not defined by the above terms.

FIGS. 2 to 9 sequentially show the process of manufacturing the PCB having a plating pattern buried in a via according to an embodiment of the present invention.

First, an insulating substrate 100 is provided, and via holes 150 are formed in the insulating substrate 100.

Figure 2:
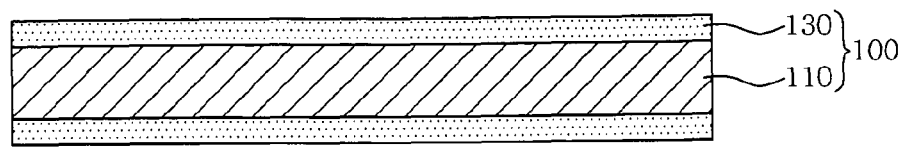
FIGS. 2 to 9 are cross-sectional views showing a process of manufacturing a PCB having a plating pattern buried in a via, according to an embodiment of the present invention.

As shown in FIG. 2, an insulating substrate 100 is prepared. The insulating substrate 100 used in the present invention includes a core substrate 110 made of a glass fiber-reinforced thermosetting resin and an insulating layer 130 formed on upper and lower surfaces of the core substrate 110. The insulating layer 130 may be formed of a polymer material such as a thermosetting resin, for example, a prepreg, or a typical resin substrate material such as an epoxy resin, for example, FR-4, BT (Bismaleimide Triazine), ABF (Ajinomoto Build up Film), etc. However, the construction of the insulating substrate 100 is not particularly limited thereto. Alternatively, the insulating substrate 100 may be made of an electrically insulating polymer material which is not exemplified in the present invention, or an insulating substrate 100 made of a single material may be used.

Figure 3:
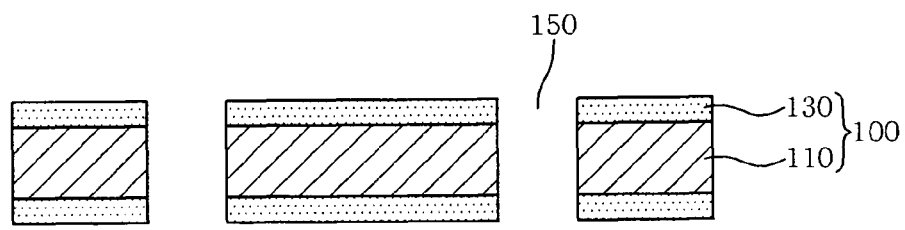

Next, as shown in FIG. 3, via holes 150 are formed in the insulating substrate 100. The via holes 150 may be formed by means of a mechanical drill using a cutting blade, or a laser drill using a laser. In the embodiment of the present invention, the via holes 150 may be formed using a CNC drill.

Figure 4:
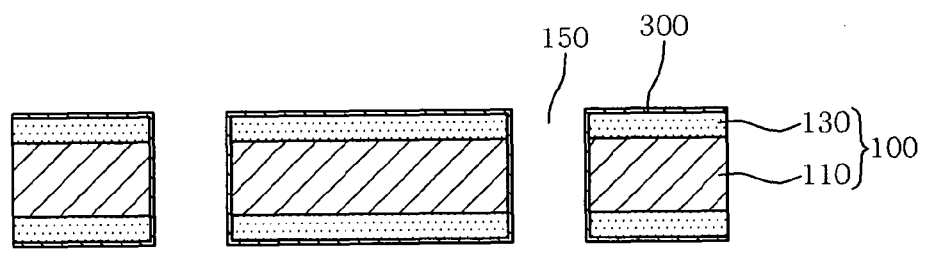

Next, as shown in FIG. 4, a metal layer 300 is formed on the inner walls of the via holes 150.

To this end, a seed layer is formed on an outer layer of the insulating substrate 100 including the inner walls of the via holes 150, and electroplating is then performed on the seed layer, thus forming the metal layer 300. Specifically, the surface of the insulating substrate 100 is roughened and then subjected to electroless plating which is a pretreatment procedure of electroplating, so that the seed layer is formed on the outer layer of the insulating substrate 100 including the inner walls of the via holes 150. The seed layer may be formed through for example metal deposition by sputtering. In this way, when the seed layer is formed, electroplating is performed using the seed layer as a lead wire, thus forming the metal layer 300. The metal layer 300 may be made of an electrically conductive metal, for example, gold, silver, copper, nickel, etc. As such, the metal for the seed layer may be different from the metal used for electroplating. In the embodiment of the present invention, the metal layer 300 is formed using copper.

Although the process of forming the metal layer 300 on the entire surface of the insulating substrate 100 including the inner walls of the via holes 150 is illustrated, the present invention is not limited thereto. Alternatively, the metal layer 300 may be formed only on the inner walls of the via holes 150 by forming a plating resist (not shown) on the surface of the insulating substrate 100.

Figure 5:
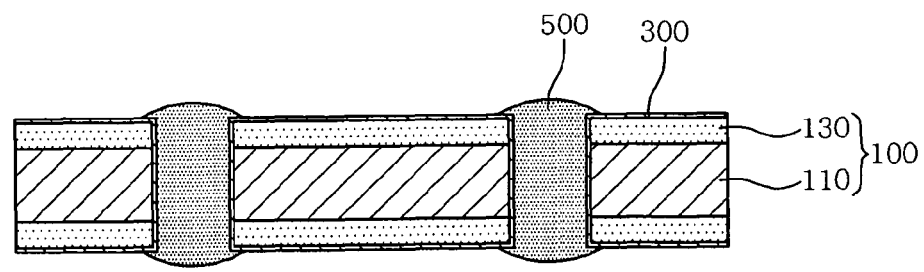

Next, as shown in FIG. 5, the via holes 150 are filled with a filler 500. The filler 500 typically includes plugging ink composed of an insulating ink paste, but may include a conductive paste containing conductive metal powder.

Figure 6:
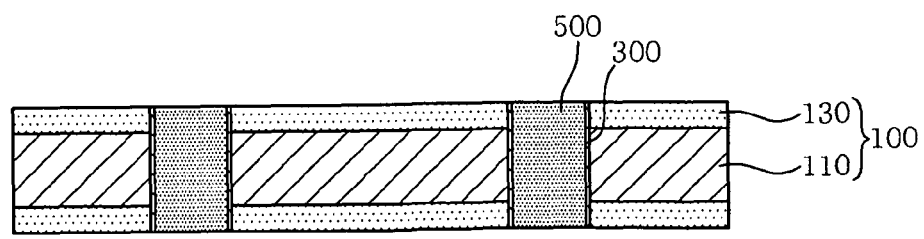

Next, as shown in FIG. 6, the metal layer 300 and the filler 500 are removed from the upper and lower surfaces of the insulating substrate 100. In the course of filling the via holes 150 with the filler 500, when there is filler 500 protruding outside of the via holes 150, the filler 500 protruding from the upper and lower surfaces of the insulating substrate 100 is removed. As in the embodiment of the present invention, in the case where the metal layer 300 is formed on the upper and lower surfaces of the insulating substrate 100, the metal layer 300 formed on the upper and lower surfaces of the insulating substrate 100 may be removed together with the filler 500. This procedure may be performed through polishing using a polishing brush or buff.

Figure 7:
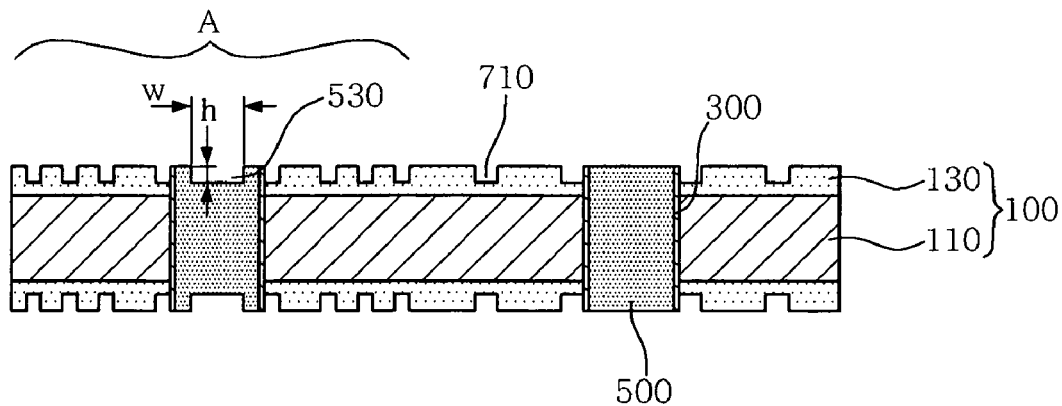

Next, as shown in FIG. 7, a negative pattern 710 for forming a circuit pattern is formed in the upper and lower surfaces of the insulating substrate 100, and a negative pattern 530 for forming a plating pattern is selectively formed in upper and lower ends of the filler 500. For example, the negative pattern is formed as designed in the upper and lower surfaces of the insulating substrate 100 and the upper and lower ends of the filler 500 through control of a laser pulse and the number of laser shots, by using a laser drill using a YAG laser or a CO2 laser.

When the PCB is manufactured, a circuit pattern 910 to be formed on the PCB is designed, and then the circuit pattern 910 is formed on the PCB depending on the design. As such, the circuit pattern 910 is not distributed at a uniform density over the entire area of the PCB, and a PCB may have a region where the circuit pattern 910 is densely formed and a region where the circuit pattern 910 is sparsely formed, depending on the end uses and the functions thereof. The difference in density of the circuit pattern 910 may cause the plating thickness deviation in the course of forming the circuit pattern 910 through electroplating. In the embodiment of the present invention, to overcome the differing densities of the circuit pattern 910 so as to minimize the plating thickness deviation, a plating pattern 930 is formed in the via which is relatively wider than the circuit pattern 910.

Thus, before the negative pattern 710 for forming a circuit pattern and the negative pattern 530 for forming a plating pattern to be formed into the circuit pattern 910 and the plating pattern 930 respectively in the subsequent process are formed in the insulating substrate 100, with reference to the design (drawing or computer image) of the circuit pattern 910, a circuit pattern dense region A where the circuit pattern 910 to be formed on the insulating substrate 100 is densely disposed is defined on the insulating substrate 100. In this way, when the circuit pattern dense region A is defined, the negative pattern 530 for forming a plating pattern is formed only in the filler 500 within the circuit pattern dense region A defined as above, thus making it possible to overcome the difference in density of the circuit pattern 910 between the circuit pattern dense region A and any other region. Alternatively, it is possible to form the negative pattern 710 for forming a circuit pattern, define the circuit pattern dense region A based on the above pattern, and then form the negative pattern 530 for forming a plating pattern. As the density of the PCB becomes higher, the number of vias to be formed per unit area is increased and the width of the via is relatively larger than that of the circuit pattern 910. Therefore, when such a via is used, the plating thickness deviation occurring in the subsequent electroplating process may be remarkably reduced.

Although the negative pattern 530 for forming a plating pattern may be formed at the same depth as the circuit pattern 910, if necessary, adjusting the width w and the depth h of the negative pattern may be more effective. Specifically, defining the width w and the depth h of the negative pattern 530 to be formed in the filler 500 in consideration of the density of the circuit pattern 910 of the circuit pattern dense region A may precede forming the negative pattern 530 for forming a plating pattern.

Although the present invention only illustrates how the position, the width and the depth of the plating pattern 930 are adjusted in consideration of only the difference in density of the circuit pattern 910 formed on the PCB, the above parameters may vary for other reasons. Specifically, the position of the application of current which is another reason causing the plating thickness deviation may be considered, or the position, the width and the depth of the plating pattern 930 may be adjusted so as to reduce the plating thickness deviation in consideration of the plating thickness deviation data measured on the PCB manufactured in the absence of the plating pattern 930.

Next, the circuit pattern 910 and the plating pattern 930 are respectively formed in the negative pattern 710 for forming a circuit pattern and the negative pattern 530 for forming a plating pattern.

Figure 8:
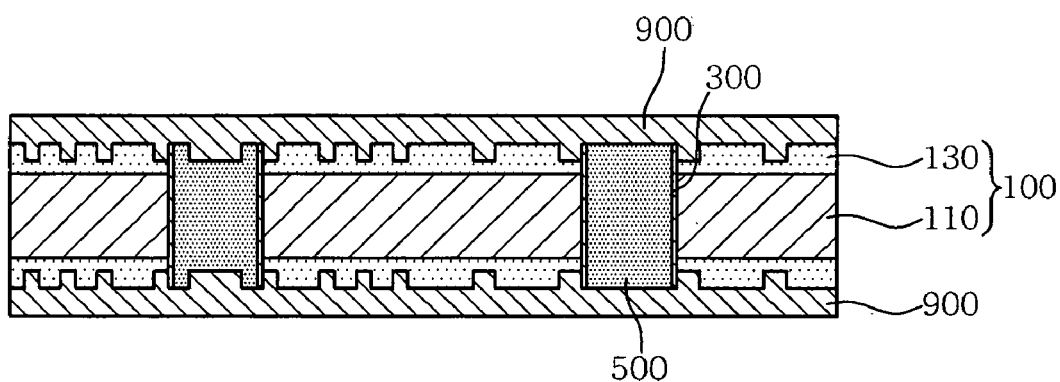

As shown in FIG. 8, a plating layer 900 is formed on the upper and lower surfaces of the insulating substrate 100 including the negative pattern 710 for forming a circuit pattern and the negative pattern 530 for forming a plating pattern. The plating layer 900 may include an electroless plating layer and an electroplating layer. The electroless plating layer is formed, after which electroplating is performed using the electroless plating layer as a lead wire, thus obtaining the plating layer 900. Because the negative pattern 530 for forming a plating pattern which prevents the generation of plating deviation is formed in the upper and lower ends of the via, the plating layer 900 having only the thickness deviation adequate for performing the subsequent process may be formed.

Figure 9:
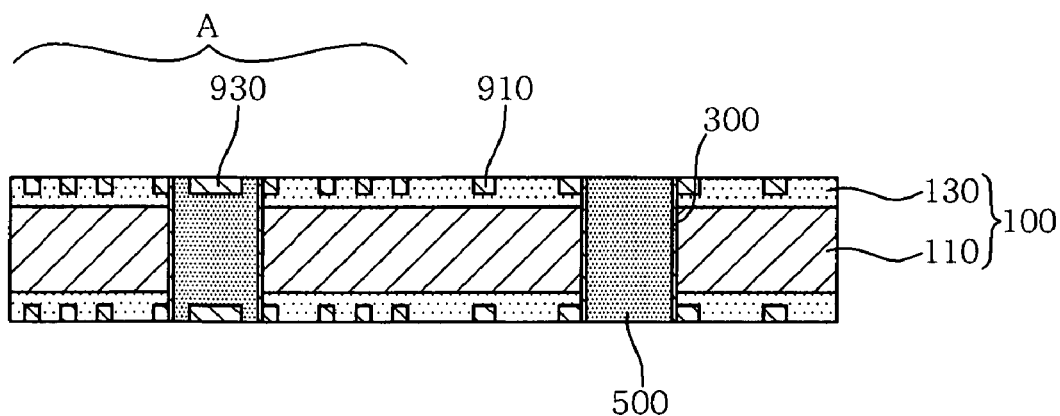

Next, as shown in FIG. 9, the plating layer 900 is removed from the upper and lower surfaces of the insulating substrate 100. This procedure may be performed through polishing using a polishing brush or buff, chemical etching, or a combination thereof. Because the thickness deviation of the plating layer 900 is small, this procedure may be performed in a manner such that the plating layer 900 is uniformly removed in a thickness direction. Accordingly, the circuit pattern 910 and the plating pattern may be respectively formed in the negative pattern 710 for forming a circuit pattern and the negative pattern 530 for forming a plating pattern.

The method of manufacturing the PCB according to the present invention is advantageous because forming the negative pattern 530 for forming a plating pattern which prevents the generation of plating deviation in the upper and lower ends of the via is conducted before performing the plating process for forming the circuit pattern 910, thus remarkably reducing the generation of plating thickness deviation in the plating process for forming the circuit pattern 910.

Hence, the circuit pattern 910 having a uniform thickness can be formed, thus making it possible to manufacture a PCB having improved electrical signal transmission performance.

Further, when the PCB is thus manufactured, defect rates occurring due to the plating deviation may be reduced, thus improving productivity.

Below, with reference to FIG. 9, the PCB having a plating pattern buried in a via according to the embodiment of the present invention is described. Herein, the redundant description is omitted.

Referring to FIG. 9, the PCB according to the embodiment of the present invention includes the insulating substrate 100 including an electrically insulating resin, the via holes 150 passing through the insulating substrate 100, the via including the metal layer 300 formed on the inner walls of the via holes 150 and the filler 500 charged in the via holes 150, the circuit layer having the circuit pattern 910 which is buried in the insulating substrate 100 and transmits electrical signals, and the plating pattern 930 buried in the filler 500.

The circuit layer is an electrically conductive metal pattern for transmitting electrical signals and may be made of a metal for example gold, silver, copper, nickel, etc.

The circuit layer is buried in the insulating substrate 100 but has an exposed surface which is exposed to the outside of the insulating substrate 100. The exposed surface indicates a surface of the circuit layer which is not covered by the insulating substrate 100 in which the circuit layer is buried, and does not indicate a surface which is exposed to the outside of another insulating layer 130 or a solder resist layer which may be formed on the outer surface of the insulating layer 130. The height of the exposed surface of the circuit pattern 910 on the basis of the center line of the insulating substrate 100 in a thickness direction may be the same as or lower than the surface height of the insulating substrate 100.

The via includes the metal layer 300 formed on the inner walls of the via holes to electrically connect the upper and lower insulating layers 130 to each other and the filler 500 charged in the via holes 150. The metal layer 300 may be made of a metal for example gold, silver, copper, nickel, etc. The filler 500 may be plugging ink composed of an insulating ink paste or plugging ink composed of a conductive paste.

The insulating substrate 100 includes the core substrate 110 formed of a glass fiber-reinforced thermosetting resin and the insulating layer 130 formed on the upper and lower surfaces of the core substrate 110. The insulating layer 130 may be made of a polymer material such as a thermosetting resin, for example, a prepreg, or a typical resin substrate material, such as an epoxy resin, for example, FR-4, BT (Bismaleimide Triazine), ABF (Ajinomoto Build up Film), etc. However, the construction of the insulating substrate 100 is not particularly limited thereto. Alternatively, the insulating substrate 100 may be formed of an electrically insulating polymer material which is not exemplified in the present invention, or an insulating substrate 100 made of a single material may be used.

The plating pattern 930, which is a metal pattern buried in the upper and lower ends of the via, may be formed of a material similar to the material for the circuit pattern 910, and may have the width and the depth which are defined in consideration of the density of the circuit pattern 910 of the circuit pattern dense region A.

When the PCB is sectioned into a plurality of regions, the circuit pattern dense region A indicates a region having the density of the circuit pattern 910 higher than that of any other region. Although only one circuit pattern dense region A is illustrated in FIG. 9, a plurality of circuit pattern dense regions A may be present even on a single PCB.

As such, the plating pattern 930 may be formed only within the circuit pattern dense region A.

Because the PCB thus constructed has the plating pattern which prevents the generation of plating deviation, the circuit pattern having a uniform thickness and constant resistance can be formed, thus improving electrical signal transmission performance.

As described hereinbefore, the present invention provides a PCB having a plating pattern buried in a via and a method of manufacturing the same. According to the present invention, the PCB having a plating pattern buried in a via includes the plating pattern which prevents the generation of plating deviation, thus forming a circuit pattern having a uniform thickness and constant resistance, resulting in improved electrical signal transmission performance.

Also, according to the present invention, the method of manufacturing the PCB includes forming a negative pattern for forming a plating pattern which prevents the generation of plating deviation in an end of a via, before performing a plating process for forming a circuit pattern, thus remarkably reducing the generation of plating thickness deviation in the plating process for forming the circuit pattern.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a printed circuit board having a plating pattern buried in a via, comprising:
   providing an insulating substrate and forming a via hole in the insulating substrate;
   forming a metal layer on an inner wall of the via hole;
   filling the via hole with a filler;
   forming a negative pattern for forming a circuit pattern on the insulating substrate, and selectively forming a negative pattern for forming a plating pattern in an end of the filler; and
   forming the circuit pattern and the plating pattern in the negative pattern for forming a circuit pattern and the negative pattern for forming a plating pattern, respectively.

2. The method as set forth in claim 1, wherein the forming the metal layer comprises forming a seed layer on an outer layer of the insulating substrate including the inner wall of the via hole and performing electroplating on the seed layer, thus forming the metal layer, wherein the method further comprises removing the metal layer and the filler formed on the insulating substrate, after filling the via hole.

3. The method as set forth in claim 1, wherein the forming the circuit pattern and the plating pattern comprises forming a plating layer on the insulating layer including the negative pattern for forming a circuit pattern and the negative pattern for forming a plating pattern and removing the plating layer formed on the insulating substrate.

4. The method as set forth in claim 1, wherein the forming the negative pattern is performed using a laser drill.

5. The method as set forth in claim 1, wherein the method further comprises defining a circuit pattern dense region where the circuit pattern to be formed on the insulating substrate is densely disposed on the insulating substrate, before forming the negative pattern, and the negative pattern for forming a plating pattern in the forming the negative pattern is formed in the filler within the circuit pattern dense region.

6. The method as set forth in claim 1, further comprising defining a circuit pattern dense region where the circuit pattern to be formed on the insulating substrate is densely disposed on the insulating substrate and defining a width and a depth of the negative pattern to be formed in the filler in consideration of a density of the circuit pattern of the circuit pattern dense region, before forming the negative pattern.

* * * * *